United States Patent
Nakamura et al.

(10) Patent No.: US 10,490,398 B2
(45) Date of Patent: Nov. 26, 2019

(54) MANUFACTURING METHOD OF MONOCRYSTALLINE SILICON AND MONOCRYSTALLINE SILICON

(71) Applicant: SUMCO CORPORATION, Tokyo (JP)

(72) Inventors: Tsuyoshi Nakamura, Tokyo (JP); Eiichi Kawasaki, Tokyo (JP); Shogo Kobayashi, Tokyo (JP); Yoshihiro Oshiro, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 150 days.

(21) Appl. No.: 15/595,196

(22) Filed: May 15, 2017

(65) Prior Publication Data

US 2017/0338098 A1 Nov. 23, 2017

(30) Foreign Application Priority Data

May 20, 2016 (JP) ................. 2016-101103

(51) Int. Cl.
| | | |
|---|---|---|
| *C30B 15/14* | (2006.01) | |
| *H01L 21/02* | (2006.01) | |
| *C30B 29/06* | (2006.01) | |
| *H01L 21/033* | (2006.01) | |
| *H01L 21/263* | (2006.01) | |

(Continued)

(52) U.S. Cl.
CPC ........ *H01L 21/02008* (2013.01); *C30B 15/14* (2013.01); *C30B 29/06* (2013.01); *H01L 21/02* (2013.01); *H01L 21/0334* (2013.01); *H01L 21/2636* (2013.01); *H01L 21/67011* (2013.01); *H01L 2021/60202* (2013.01)

(58) Field of Classification Search
CPC ........ C30B 15/00; C30B 15/005; C30B 15/20
See application file for complete search history.

(56) References Cited

U.S. PATENT DOCUMENTS

| | | | | |
|---|---|---|---|---|
| 4,662,982 A | * | 5/1987 | Jablonski | C30B 15/005 117/13 |
| 8,821,636 B2 | * | 9/2014 | Abe | C30B 15/00 117/13 |
| 2011/0056428 A1 | * | 3/2011 | Uto | C30B 15/20 117/35 |

FOREIGN PATENT DOCUMENTS

| | | |
|---|---|---|
| JP | 2006-169016 A | 6/2006 |
| JP | 2014-512330 A | 5/2014 |
| JP | 2015-40142 | 3/2015 |

OTHER PUBLICATIONS

Notice of Reason(s) for Rejection for JP App. No. 2016-101103 dated Feb. 19, 2019 (w/ translation).

* cited by examiner

*Primary Examiner* — Robert M Kunemund
(74) *Attorney, Agent, or Firm* — Greenblum & Bernstein, P.L.C.

(57) ABSTRACT

A manufacturing method of a monocrystalline silicon includes: a growth step in which a seed crystal having contacted a silicon melt is pulled up and a crucible is rotated and raised to form a straight body of the monocrystalline silicon; a separating step in which the monocrystalline silicon is separated from the silicon melt; a state holding step in which the crucible and the monocrystalline silicon are lowered and the monocrystalline silicon is kept at a level at which an upper end of the straight body is located at the same level as an upper end of a heat shield or is located below the upper end of the heat shield for a predetermined time; and a draw-out step in which the monocrystalline silicon is drawn out of a chamber.

8 Claims, 5 Drawing Sheets

(51) Int. Cl.
*H01L 21/67* (2006.01)
*H01L 21/60* (2006.01)

MANUFACTURING METHOD OF MONOCRYSTALLINE SILICON AND MONOCRYSTALLINE SILICON

The entire disclosure of Japanese Patent Application No. 2016-101103 filed May 20, 2016 is expressly incorporated by reference herein.

TECHNICAL FIELD

The present invention relates to a manufacturing method of a monocrystalline silicon, and a monocrystalline silicon.

BACKGROUND ART

In general, monocrystalline silicon grown by Czochralski process (CZ process) includes thermal donors derived from interstitial oxygen. The thermal donors are generated depending on a thermal hysteresis experienced by the monocrystalline silicon when the monocrystalline silicon is pulled up, where it is known that the thermal donors are generated on a section of a straight body near an upper end thereof but are not generated on a section of the straight body near a lower end thereof. When there are thermal donors in the monocrystalline silicon used for a target material of sputtering or a plasma etching electrode, the resistivity of the monocrystalline silicon during the sputtering or plasma etching process becomes different from a target resistance value.

In order to restrain the above disadvantage, a donor-killer heat treatment, in which a region with the thermal donors is held at a temperature of 650 degrees C. or more for a predetermined time, is typically applied.

However, since the donor-killer heat treatment may sometimes result in a slip dislocation, a method without applying the donor-killer heat treatment has also been studied. For instance, Patent Literature 1 (JP 2015-40142 A) discloses a manufacturing method of a monocrystalline silicon used for a target material and the like, in which the resistivity of a section of 5-50 mm thick cut out from the monocrystalline silicon can be controlled to be within a range of a target resistivity ±10% without applying the donor-killer heat treatment by pulling up a monocrystalline silicon whose resistivity ranges from 10 Ω·cm to 50 Ω·cm.

However, according to the method disclosed in Patent Literature 1, it is possible that the resistivity cannot be controlled to be within the range of 10 Ω·cm to 50 Ω·cm due to the thermal hysteresis experienced by the monocrystalline silicon when the monocrystalline silicon is pulled up or uneven oxygen concentration of the monocrystalline silicon, so that the resistivity during the sputtering or plasma etching process may become different from the target value and desired sputtering and the like may be unable to be performed.

SUMMARY OF THE INVENTION

An object of the invention is to provide a manufacturing method of a monocrystalline silicon capable of reliably providing, without applying a donor-killer heat treatment, a region with which desired sputtering or plasma etching can be performed, and a monocrystalline silicon.

After dedicated studies, the inventors have found the following idea.

Initially, an arrangement of a monocrystal pull-up apparatus 1 as a basis of a simulation will be described below.

Figure 1:
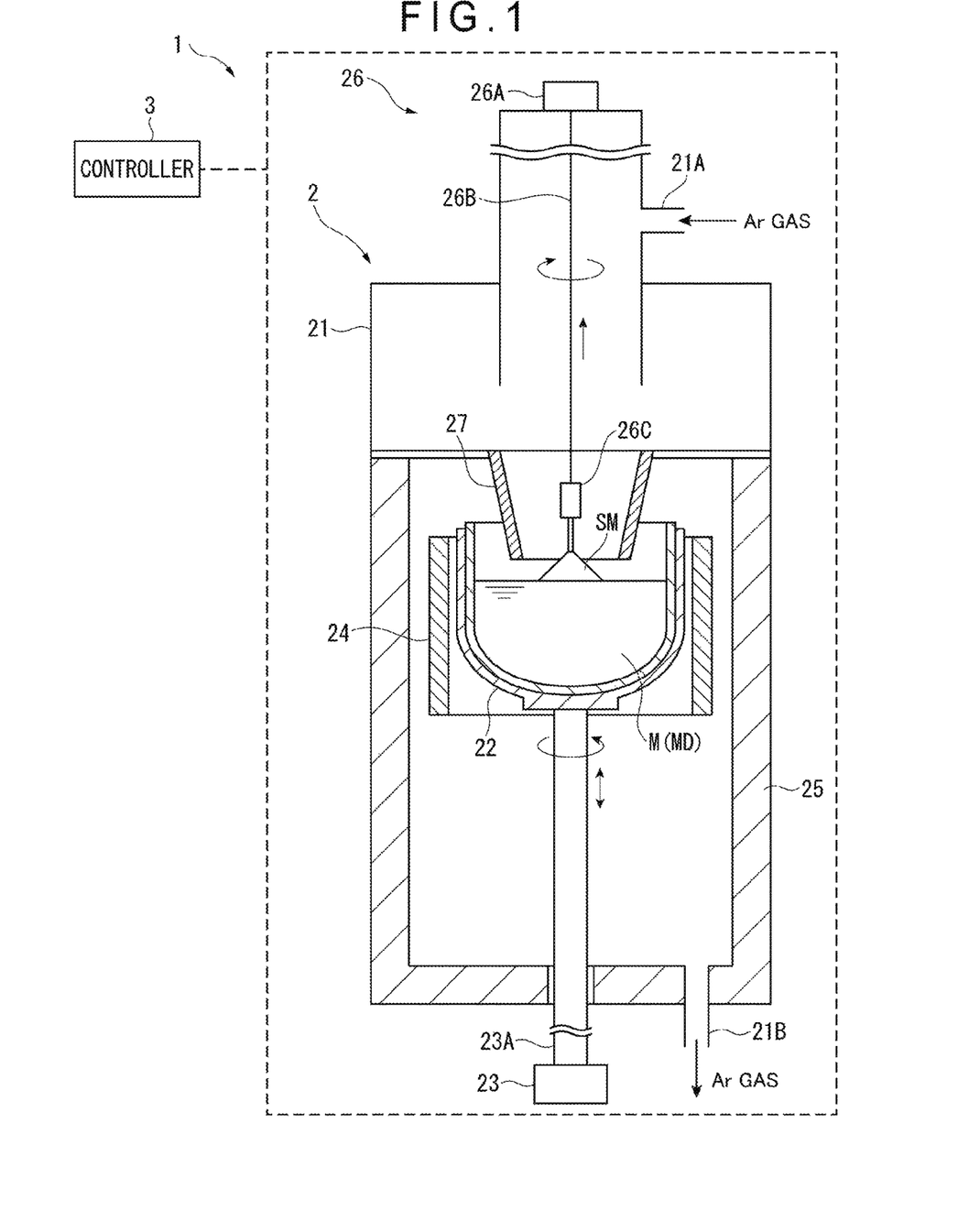
FIG. 1 is a cross section of a monocrystal pull-up apparatus.

As shown in FIG. 1, the monocrystal pull-up apparatus 1 is an apparatus usable for the CZ process and includes a pull-up apparatus body 2 and a controller 3. The pull-up apparatus body 2 includes a chamber 21, a crucible 22 disposed within the chamber 21, a crucible driver 23, a heater 24, a heat insulating cylinder 25, a pull-up portion 26 and a heat shield 27.

A gas inlet 21A through which an inert gas (e.g. Ar gas) is introduced into the chamber 21 is provided at an upper part of the chamber 21. A gas outlet 21B through which the gas in the chamber 21 is discharged when a vacuum pump (not shown) is driven is provided at a lower part of the chamber 21.

The crucible 22 is configured to melt polycrystalline silicon (i.e. a material of monocrystalline silicon SM) to provide a silicon melt M.

The crucible driver 23 is configured to vertically move the crucible 22 at a predetermined speed and to rotate the crucible 22 around a support shaft 23A connected to a lower end of the crucible 22 under a control of the controller 3.

The heater 24 is disposed outside the crucible 22 and is configured to heat the crucible 22 to melt the silicon inside the crucible 22.

The heat insulating cylinder 25 is disposed to surround the crucible 22 and the heater 24.

The pull-up portion 26 includes a pull-up driver 26A, and a pull-up cable 26B having a first end connected to the pull-up driver 26A. A seed holder 26C configured to hold a seed crystal or a doping device (not shown) is attached to a second end of the pull-up cable 26B. The doping device is configured to dope a dopant in the silicon melt M in the crucible 22 to provide a dopant-added melt MD. The pull-up driver 26A is configured to vertically move and rotate the pull-up cable 26B at a predetermined speed under the control of the controller 3.

The heat shield 27 is in a form of a hollow truncated cone surrounding the monocrystalline silicon SM at a position above the crucible 22 and is configured to shield a radiation heat upwardly radiated from the heater 24.

The controller 3 is configured to control a gas flow rate in the chamber 21, a pressure in the furnace, and the vertical movement and rotation of the crucible 22 and the pull-up cable 26B based on an input by an operator to manufacture the monocrystalline silicon SM.

The following thermal analysis simulation was performed on the basis of the above-described monocrystal pull-up apparatus 1.

Figure 2A:
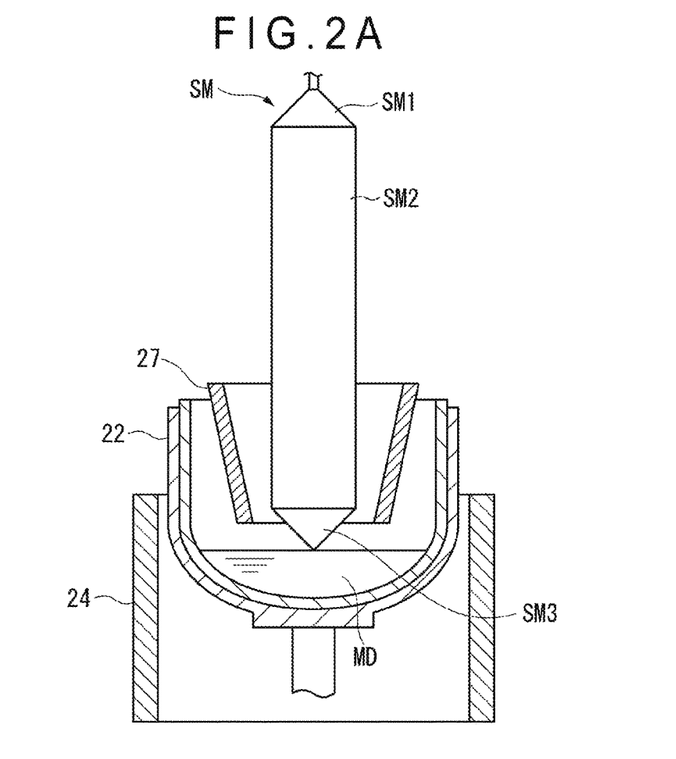
FIG. 2A illustrates a simulation performed in order to derive the invention, which shows a state immediately after a growth step.

Initially, a shoulder SM1, a straight body SM2 and a tail SM3 were formed as shown in FIG. 2A (growth step). The diameter of the straight body SM2 was 450 mm and the length of the straight body SM2 was 1000 mm.

Figure 2B:
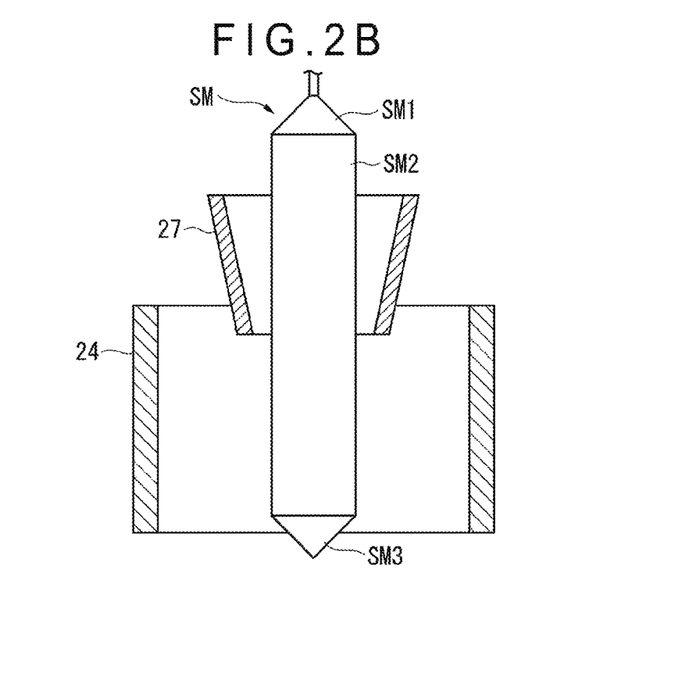
FIG. 2B illustrates the simulation performed in order to derive the invention, showing a state in which a monocrystalline silicon is lowered after the growth step.

Subsequently, the monocrystalline silicon SM was separated from the dopant-added melt MD (separating step), and, while the power of the heater 24 was kept equal to the power when the formation of the straight body SM2 was finished (i.e. 100% power), the crucible 22 and the monocrystalline silicon SM were lowered and were stopped while a middle portion of the monocrystalline silicon SM was located within the heat shield 27 as shown in FIG. 2B. Then, a temperature distribution at the center of the monocrystalline silicon SM after keeping the above state for 60 minutes was evaluated.

Further, temperature distributions at the center of the monocrystalline silicon SM were evaluated with the power of the heater 24 after the separating step being set at 80%, 60%, 40% and 20% of the power when the formation of the straight body SM2 was finished, and after keeping the state shown in FIG. 2B for 60 minutes. The results are shown in FIG. 3.

It should be noted that 1683 K (1410 degrees C.) is the melting point of silicon. Further, 923 K (650 degrees C.) is a typical temperature for the donor-killer heat treatment. The thermal donors are generated when the temperature is lower than 923 K.

Figure 3:
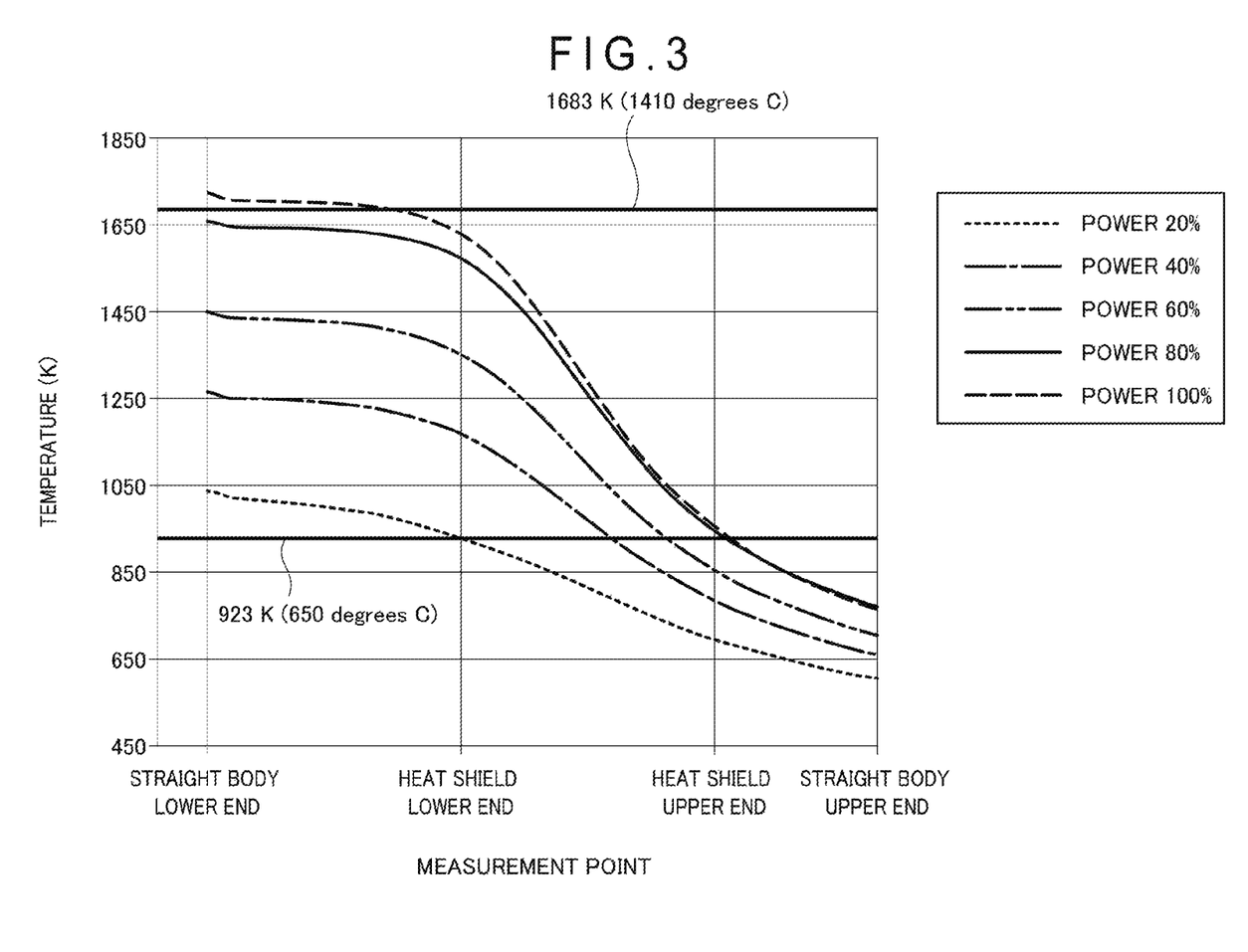
FIG. 3 is a graph showing results of the simulation.

As shown in FIG. 3, it is observed that the temperature of the region near the lower end of the straight body SM2 becomes higher than the temperature of the region near the upper end irrespective of the power of the heater 24 after the separating step. It is believed that this is because, as shown in FIG. 2B, the region near the lower end of the straight body SM2 is surrounded by the heater 24, the distance between the straight body SM2 and the heater 24 is increased toward the upper end, and heat dissipation at the region surrounded by the heat shield 27 is restrained by the heat shield 27.

Further, it is observed that, when the power of the heater 24 is at 20%, the temperature of the region of the straight body SM2 below the lower end of the heat shield 27 becomes 650 degrees C. or more, but the region above the lower end of the heat shield 27 becomes less than 650 degrees C. It is supposed that the thermal donors are not present in the region whose temperature is 650 degrees C. or more or, even when the thermal donors are generated while the monocrystalline silicon SM is pulled up, the thermal donors are eliminated because the monocrystalline silicon SM is subjected to an environment similar to that of the donor-killer heat treatment.

On the other hand, it is observed that, when the power of the heater 24 is at 40%, 60%, 80%, and 100%, the temperature becomes 650 degrees C. or more at least at a part of the region of the straight body SM2 situated within the heat shield 27 and the region below the lower end of the heat shield 27. It is thus believed that the region in which the thermal donors are present accounts for less than half of the entire straight body SM2.

Further, it is observed that, when the power of the heater 24 is at 100%, the temperature of the monocrystalline silicon SM at the region below the lower end of the heat shield 27 becomes 1410 degrees C. or more and the monocrystalline silicon SM may be melted.

It is also believed that, in a typical draw-out process in which the power of the heater 24 is set at 0% (referred to as "to power off the heater" hereinafter) after the separating step and the monocrystalline silicon SM is pulled up without lowering to draw the monocrystalline silicon SM out of the chamber 21, even when the thermal donors are generated at the region near the upper end of the straight body SM2 while the monocrystalline silicon SM is pulled up, since the monocrystalline silicon SM is not subjected to an environment similar to that in the donor-killer heat treatment, the region in which the thermal donors are present is enlarged as compared with an instance in which the process shown in FIG. 2B is applied.

Since no thermal donor is present in the region held at 650 degrees C. or more for 60 minutes, when the heater 24 is powered off after the holding process and the monocrystalline silicon SM is pulled up while being rapidly cooled to be drawn out of the chamber 21, the time for the straight body SM2 to stay in a temperature range in which the thermal donors are generated (e.g. approximately 450 degrees C.) can be shortened, thereby restraining the generation of the thermal donors to the minimum. It is believed that, consequently, the resistivity of the monocrystalline silicon SM when sputtering or plasma etching process is performed can be restrained from being out of a target value by using the region held at 650 degrees C. or more even without applying the donor-killer heat treatment.

The invention has been made in view of the above findings.

A manufacturing method of a monocrystalline silicon according to an aspect of the invention uses a monocrystal pull-up apparatus including: a crucible configured to receive a silicon material; a crucible driver configured to vertically move and rotate the crucible; a heater configured to heat the crucible to melt the silicon material; a pull-up portion configured to pull up a seed crystal after bringing the seed crystal into contact with a silicon melt in the crucible to grow the monocrystalline silicon; a hollow cylindrical heat shield disposed above the crucible and configured to surround the monocrystalline silicon; and a chamber configured to house the crucible, the heater and the heat shield, the method including: a growth step in which the seed crystal having contacted the silicon melt is pulled up and the crucible is rotated and raised to form a straight body of the monocrystalline silicon; a separating step in which the monocrystalline silicon is separated from the silicon melt; a state holding step in which the crucible and the monocrystalline silicon are lowered and the monocrystalline silicon is kept located below a level at which the monocrystalline silicon is separated from the silicon melt for a predetermined time; and a draw-out step in which the monocrystalline silicon is drawn out of the chamber.

According to the above aspect of the invention, since the monocrystalline silicon is kept for a predetermined time below a level at which the monocrystalline silicon is separated from the silicon melt after the separating step, at least the region of the straight body below the lower end of the heat shield can be kept for the predetermined time at 650 degrees C. or more (i.e. in an environment equivalent to the donor-killer heat treatment), so that the region without the thermal donors can be reliably increased as compared to the typical process or the process disclosed in Patent Literature 1 in which the monocrystalline silicon is pulled up without being lowered after the separating step. Accordingly, without applying the donor-killer heat treatment to the monocrystalline silicon drawn out of the monocrystal pull-up apparatus, the resistivity of the monocrystalline silicon during the sputtering or plasma etching can be restrained from being out of a target value, so that the desired region usable for sputtering or plasma etching can be reliably obtained.

It should be noted that at least 20 minutes is sufficient for the predetermined time for keeping the monocrystalline silicon below the level at which the monocrystalline silicon is separated from the silicon melt. Since the productivity deteriorates when the holding time becomes excessively long, the holding time is preferably 120 minutes or less.

In the manufacturing method of a monocrystalline silicon according to the above aspect of the invention, it is preferable that, in the state holding step, an upper end of the straight body is kept at the same level as an upper end of the heat shield or is kept below the upper end of the heat shield for the predetermined time.

According to the above arrangement, more region without the thermal donors can be ensured by keeping the upper end of the straight body to be at the same level as the upper end of the heat shield or below the upper end of the heat shield for the predetermined time, so that the region usable for the desired sputtering or plasma etching can be increased.

In the manufacturing method of a monocrystalline silicon according to the above aspect of the invention, it is preferable that, in the state holding step, a power of the heater is kept in a range from 40% to 80% of the power at an end of a formation of the straight body.

According to the above arrangement, by keeping the power of the heater to be in a range from 40% to 80% of the power at the end of the formation of the straight body in the state holding step, at least a part of the region of the straight body located in the heat shield and the region of the straight body below the lower end of the heat shield can be kept in an environment equivalent to the environment in the donor-killer heat treatment, so that the region without the thermal donors can be further increased.

In the manufacturing method of a monocrystalline silicon according to the above aspect of the invention, it is preferable that, in the state holding step, an upper end of the straight body is kept at the same level as a lower end of the heat shield or is kept below the lower end of the heat shield for the predetermined time.

According to the above arrangement, the entire straight body can be reliably kept for the predetermined time at 650 degrees C. or more in the state holding step, so that the region without the thermal donors can be further increased.

It should be noted that at least 20 minutes is sufficient for the predetermined time for keeping the upper end of the straight body at the same level as the lower end of the heat shield or below the lower end of the heat shield. Since the productivity deteriorates when the holding time becomes excessively long, the holding time is preferably 120 minutes or less.

In the manufacturing method of a monocrystalline silicon according to the above aspect of the invention, it is preferable that the straight body grown in the growth step has a diameter of 400 mm or more.

According to the above arrangement, without employing a large-sized donor-killer heat treatment machine, a large-sized monocrystalline silicon having a diameter of 400 mm or more and usable for target material and a plasma etching electrode can be manufactured.

In the manufacturing method of a monocrystalline silicon according to the above aspect of the invention, it is preferable that the straight body grown in the growth step has a resistivity in a range from 5 Ω·cm to 60 Ω·cm.

In the manufacturing method of a monocrystalline silicon according to the above aspect of the invention, it is preferable that the straight body grown in the growth step has an oxygen concentration of $1 \times 10^{17}$ atoms/cm$^3$ (ASTM 1979) or more.

Though no thermal donor is generated when the resistivity and/or oxygen concentration is out of the above range, the thermal donor is likely to be caused within the above range.

According to the above arrangement, even the monocrystalline silicon in which the thermal donor is likely to be generated can reliably provide the region usable for desired sputtering or plasma etching.

In the manufacturing method of a monocrystalline silicon according to the above aspect of the invention, it is preferable that the monocrystalline silicon is drawn out in the draw-out step while the power of the heater is turned on, and, after the draw-out step, the silicon material is added in the crucible and a next monocrystalline silicon is manufactured by performing the growth step, the separating step, the state holding step and the draw-out step.

According to the above arrangement, since the monocrystalline silicon is drawn out after the state holding step while the heater is powered on, and subsequently the silicon material is added in the crucible to manufacture the next monocrystalline silicon, as compared with an instance in which the heater is powered off before the draw-out step, the time for heating the crucible added with the silicon material can be shortened, thereby improving the production efficiency.

A monocrystalline silicon according to another aspect of the invention includes a straight body whose diameter is 400 mm or more, in which the straight body includes a lengthwise continuous region of 540 mm or more whose change in resistivity is 5% or less before and after being subjected to a heat treatment at 650 degrees C. for 30 minutes.

DESCRIPTION OF EMBODIMENT(S)

Exemplary Embodiment

A manufacturing method of a monocrystalline silicon SM in the CZ process using the monocrystal pull-up apparatus 1 according to an exemplary embodiment of the invention will be described below.

The monocrystalline silicon SM is used as a target material for sputtering and an electrode for plasma etching.

Initially, in order to manufacture the monocrystalline silicon SM, the controller 3 controls the heater 24 to heat the crucible 22 to provide the dopant-added melt MD. It is preferable that the dopant is added so that the resistivity of the monocrystalline silicon SM falls in a range from 5 Ω·cm to 60 Ω·cm.

Subsequently, the controller 3 keeps a decompressed inert atmosphere in the chamber 21 and lowers the pull-up cable 26B to bring the seed crystal into contact with the dopant-added melt MD. Then, the controller 3 pulls up (while rotating, as necessary) the pull-up cable 26B and raises (while rotating, as necessary) the crucible 22 to pull up the monocrystalline silicon SM as shown in FIG. 2A (growth step) and performs a separating step. In the growth step, it is preferable that the monocrystalline silicon SM is pulled up so that an oxygen concentration of the straight body SM2 becomes $1 \times 10^{17}$ atoms/cm$^3$ or more (ASTM 1979). It is also preferable in the growth step that the monocrystalline silicon SM is pulled up so that the diameter of the straight body SM2 becomes 400 mm or more and the length of the monocrystalline silicon SM becomes 300 mm or more.

Next, the controller 3 sets the power of the heater 24 to be in a range from 40% to 80% of the power at the end of the formation of the straight body SM2. Herein, the power of the heater 24 at the end of the formation of the straight body SM2 refers to a power at which the monocrystalline silicon SM can be pulled up without increasing or decreasing the diameter of the straight body SM2 when the monocrystalline silicon SM is pulled up at a preset pull-up speed.

Figure 4:
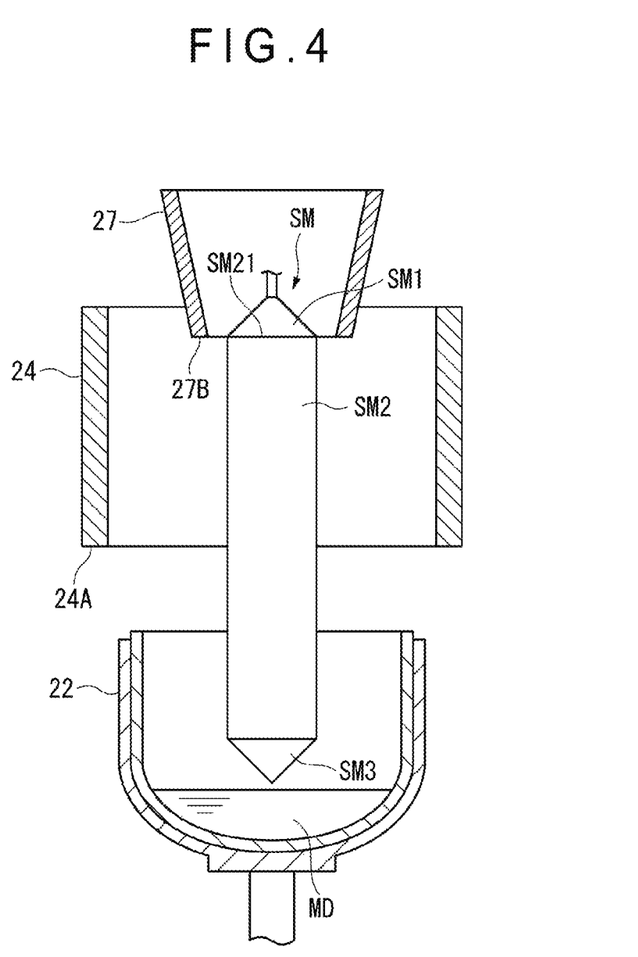
FIG. 4 illustrates a state holding step according to an exemplary embodiment of the invention.

Subsequently, the crucible 22 and the monocrystalline silicon SM are lowered and are stopped at a point at which an upper end SM21 of the straight body SM2 is at the same level as a lower end 27B of the heat shield 27 as shown in FIG. 4. The lowering speed of the crucible 22 and the monocrystalline silicon SM at this time is preferably in a range from 1 mm/min to 10 mm/min. When the crucible 22 is lowered so that the lower end of the crucible 22 is below a lower end 24A of a heat generator (not shown) of the heater 24, a lowering margin for the monocrystalline silicon SM can be ensured.

After the crucible 22 and the monocrystalline silicon SM are stopped, the state shown in FIG. 4 is kept for 30 minutes or more and 60 minutes or less (state holding step).

By performing the state holding step in which the power of the heater 24 is held in a range from 40% to 80% of the power at the end of the formation of the straight body SM2, the entire straight body SM2 is kept at 650 degrees C. or more for 20 minutes or more (i.e. in the same environment as that in the donor-killer heat treatment), so that the thermal donors can be eliminated at the time immediately after the state holding step.

After the state holding step is ended, the controller 3 powers off the heater 24 and pulls up while rapidly cooling the monocrystalline silicon SM at a speed from 1 mm/min to 10 mm/min to draw the monocrystalline silicon SM out of the chamber 21 (draw-out step). The draw-out step may be performed under typical conditions. For instance, it is preferable that the draw-out step is performed so that the cooling rate of the monocrystalline silicon SM becomes 1 degrees C./min or more. By performing the draw-out step as described above, the time for the straight body SM2 to stay in the temperature range from 400 degrees C. to 500 degrees C. can be reduced to be 100 minutes or less, so that the generation of the thermal donors during the draw-out step can be restrained to the minimum.

Advantage(s) of Exemplary Embodiment(s)

In the above-described exemplary embodiment, since the straight body SM2 is subjected to the state-holding step, the thermal donors can be eliminated from the entire straight body SM2 at the time immediately after the state holding step. Thus, by performing the subsequent draw-out step under conditions capable of restraining the generation of the thermal donors to the minimum, more region in which the thermal donors are not present can be reliably obtained than that obtained in a typical process. Accordingly, without applying the donor-killer heat treatment to the monocrystalline silicon SM drawn out of the monocrystal pull-up apparatus 1, the desired region usable for sputtering or plasma etching can be reliably obtained.

In addition, the monocrystalline silicon SM including the straight body SM2 whose diameter is 400 mm or more can be manufactured, the straight body SM2 including a lengthwise continuous region of 540 mm or more whose change in resistivity is 5% or less before and after applying a heat treatment at 650 degrees C. for 30 minutes.

Modification(s)

It should be understood that the scope of the present invention is not limited by the above exemplary embodiment, but various improvements and modifications are possible as long as the improvements and modifications are compatible with the invention.

For instance, in the state holding step, the power of the heater 24 may be held at a value less than 40% of the power at the end of the formation of the straight body SM2 or at a value more than 80% of the power at the end of the formation of the straight body SM2. It is believed that the entire straight body SM2 can also be kept in the same environment as that in the donor-killer heat treatment in the above arrangement, so that the thermal donors can be eliminated at the time immediately after the state holding step.

It is believed that, when the upper end SM21 of the straight body SM2 is situated below the lower end 27B of the heat shield 27 in the state holding step, more regions in which the thermal donors are not present can be obtained than in the above exemplary embodiment.

Figure 5:
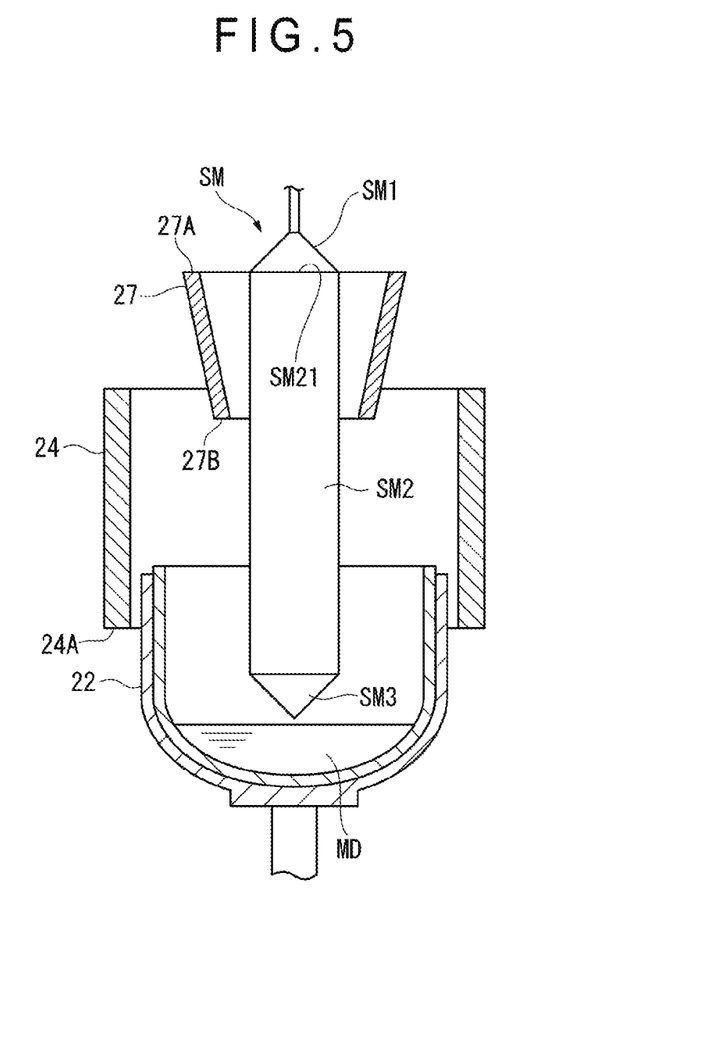
FIG. 5 illustrates a state holding step according to a modification of the invention.

The upper end SM21 of the straight body SM2 may be located at the same level as the upper end 27A of the heat shield 27 in the state holding step as shown in FIG. 5, or, alternatively, may be located below the upper end 27A. In this arrangement, though it is supposed that the region in which the thermal donors are not present decreases as compared to the above exemplary embodiment, the region can be increased as compared to a typical arrangement. Further, as shown in FIG. 2B, as long as the monocrystalline silicon SM is situated below the level at which the monocrystalline silicon SM is separated from the dopant-added melt MD, the upper end SM21 of the straight body SM2 may be located above the upper end 27A of the heat shield 27 in the state holding step. In this arrangement, though it is supposed that the region in which the thermal donors are not present decreases as compared to the instance shown in FIG. 5, the region can be increased as compared to a typical arrangement.

Though the draw-out step is performed while the heater 24 is powered off after the state holding step in the above exemplary embodiment, the pull-up step may be performed while the heater 24 is powered on and, subsequently, the silicon material and the dopant may be added in the crucible 22 to manufacture the next monocrystalline silicon SM (so-called multi-pull-up).

The monocrystalline silicon SM may have no tail SM3 and may be added with no dopant.

The diameter of the straight body SM2 may be less than 400 mm.

EXAMPLE(S)

Next, the invention will be described in more detail below with reference to Examples and Comparative Examples. However, it should be noted that the scope of the invention is by no means limited by these Examples and Comparative Examples.

In Examples, a relationship between the upper end position of the straight body during the state holding step and the product length (Experimentation 1); a relationship between the power of the heater and the product length when the upper end of the straight body was located at the same level as the upper end of the heat shield during the state holding step (Experimentation 2); and a relationship between the power of the heater and the product length when the upper end of the straight body was located at the same level as the lower end of the heat shield during the state holding step (Experimentation 3) were examined.

Common conditions in Experimentations 1 to 3 were as follows.
 (1) Properties of Monocrystalline Silicon
  Diameter of the straight body: 450 mm
  Length of the straight body: 700 mm, 1200 mm (one each)
  Oxygen concentration: 11 to 13×10$^{17}$ atoms/cm$^3$ (ASTM 1979)

Resistivity: 25 Ω·cm (at the position of the upper end of the straight body)

(2) Holding time during the state holding step: 60 minutes (3) Pull-up speed of the monocrystalline silicon during the draw-out step: 3 mm/min Experimentation 1: Relationship between the Position of the Upper End of the Straight Body in the State Holding Step and the Product Length Preparation Process of Samples Experiment 1

Initially, the monocrystal pull-up apparatus 1 shown in FIG. 1 was prepared. Then, after performing the same growth step and separating step as those in the exemplary embodiment, the heater was powered off without performing the state holding step, and then the draw-out step was performed. It should be noted that the process for Experiment 1 is the same as a typical process.

Experiment 2

A monocrystalline silicon was prepared under the same conditions as those in Experiment 1 except that the heater was powered off after the state holding step was performed subsequent to the separating step, and then the draw-out step was performed. During the state holding step, the power of the heater was kept at 60% of the power at the end of the formation of the straight body, and the upper end SM21 of the straight body SM2 was situated at the same level as the upper end 27A of the heat shield 27 as shown in FIG. 5.

Experiments 3, 4

Monocrystalline silicons were prepared under the same conditions as those in Experiment 2 except that: the upper end of the straight body was located at a vertically middle position in the heat shield in the state holding step (Experiment 3); and the upper end of the straight body was situated at the same level as the lower end of the heat shield (Experiment 4). It should be noted that an experiment using a monocrystalline silicon of 1200 mm length was not available due to limitation in the size of the chamber in Experiment 4. It should also be noted that, when the upper end of the straight body was set at a predetermined level, the monocrystalline silicon was raised and/or lowered to adjust the position of the upper end of the straight body based on the previously obtained relationship between the level of the upper end of the straight body and the level of the upper end of the heat shield.

Evaluation of Samples

The monocrystalline silicon prepared in Experiment 1 whose straight body was 700 mm in length was sliced at every 25 mm along a longitudinal direction to prepare a plurality of disc-shaped evaluation samples. Next, each of the evaluation samples was quadrisected to prepare divided samples of a sector shape and two of the divided samples were subjected to a donor-killer heat treatment, in which the divided samples were held in an atmosphere of 650 degrees C. for 30 minutes. Next, the resistivity of each of the four divided samples was measured at one point, and a difference between an average of the resistivities of the divided samples subjected to the donor-killer heat treatment and an average of the resistivities of the divided samples without being subjected to the donor-killer heat treatment was calculated. It should be noted that the point at which the resistivity was measured was set at a position corresponding to a vicinity of a central axis of the monocrystalline silicon.

Then, the regions in which the divided samples with the resistivity average difference of 5% or less were present were evaluated as a product region, the regions in which the divided samples with the resistivity average difference of more than 5% were present were evaluated as a non-product region, and a value obtained by dividing a total length of continuous ones of the product region by a total length of the straight body was defined as a product length ratio.

The same evaluation was performed for the monocrystalline silicon (Experiment 1) in Experiment 1 having the straight body length of 1200 mm and the monocrystalline silicons in Experiments 2 to 4. The evaluation results are shown in Table 1.

TABLE 1

| | | Product Length Ratio | |
|---|---|---|---|
| | Upper End Position of Straight Body during State Holding Step | Straight Body Length 700 mm | Straight Body Length 1200 mm |
| Ex. 1 | Pull-up step was performed after separating step without performing heat control step and state holding step (typical process) | 42% | 33% |
| Ex. 2 | The same level as upper end of the heat shield | 84% | 65% |
| Ex. 3 | Middle position between upper and lower ends of the heat shield | 88% | 72% |
| Ex. 4 | The same level as the lower end of the heat shield | 92% | N/A (too long straight body) |

Analysis

As shown in Table 1, it is observed that the product length ratio significantly increases irrespective of the length of the straight body in Experiments 2 to 4 as compared to Experiment 1.

From the above, it is understood that Experiments 2 to 4 correspond to Inventive Examples of the invention and Experiment 1 corresponds to Comparative Example of the invention and the ratio of the product length (i.e. the region usable for desired sputtering and plasma etching without being subjected to the donor-killer heat treatment) increases as compared to typical process by holding the power of the heater at 60% of the power at the end of the formation of the straight body, locating the upper end of the straight body between the upper and lower ends of the heat shield and holding this state for 60 minutes. It is also observable that the more the product length ratio increases, the lower the upper end of the straight body is located.

Experimentation 2: Relationship between the Power of the Heater and the Product Length in the State Holding Step when the Upper End of the Straight Body is Located at the Same Level as the Upper End of the Heat Shield Monocrystalline silicons were prepared under the same manufacturing conditions as those in Experiment 2 except that the power of the heater was set at 20% (Experiment 5), 40% (Experiment 6), and 80% (Experiment 7) of the power at the end of the formation of the straight body in the state holding step.

Then, the same evaluation as that in Experiment 1 was conducted for the monocrystalline silicons obtained in Experiments 5 to 7 and the product length ratio was calculated. The evaluation results for Experiments 1, 2, and 5-7 are shown in Table 2.

TABLE 2

| | Power of the Heater during the State Holding Step | Product Length Ratio | |
| --- | --- | --- | --- |
| | | Straight Body Length 700 mm | Straight Body Length 1200 mm |
| Ex. 1 (reference example) | — | 42% | 33% |
| Ex. 5 | 20% | 46% | 38% |
| Ex. 6 | 40% | 78% | 58% |
| Ex. 2 | 60% | 84% | 65% |
| Ex. 7 | 80% | 88% | 70% |

As shown in Table 2, it is observed that the product length ratio increases irrespective of the length of the straight body in Experiments 2 and 5 to 7 as compared to Experiment 1 (typical process).

From the above, it is understood that Experiments 5 to 7 correspond to Inventive Examples of the invention, where the upper end of the straight body is located at the same level as the upper end of the heat shield without turning off the power of the heater and this state is held for 60 minutes, so that the product length ratio increases as compared to the typical process.

It is also observed that, when comparing only Experiments 2 and 5 to 7 to each other, the product length ratio increases as the power of the heater becomes greater. Especially, in Experiments 2, 6, 7, the product length ratio exceeds 50%.

From the above, it is observable that the product length ratio significantly increases as compared to the typical process by setting the power of the heater at 40% or more when the upper end position of the straight body is at the same level as the upper end of the heat shield.

Experimentation 3: Relationship Between the Power of the Heater and the Product Length in the State Holding Step when the Upper End of the Straight Body is Located at the Same Level as the Lower End of the Heat Shield Monocrystalline silicons were prepared under the same manufacturing conditions as those in Experiment 4 except that the power of the heater was set at 20% (Experiment 8), 40% (Experiment 9), and 80% (Experiment 10) of the power at the end of the formation of the straight body in the state holding step. It should be noted that only the monocrystalline silicons each having straight body length of 700 mm were prepared in Experiment 3.

Then, the same evaluation as that in Experiment 1 was conducted for the monocrystalline silicons obtained in Experiments 8 to 10 and the product length ratio was calculated. The evaluation results for Experiments 1, 4 and 8-10 are shown in Table 3.

TABLE 3

| | Power of the Heater during the State Holding Step | Product Length Ratio Straight Body Length 700 mm |
| --- | --- | --- |
| Ex. 1 (reference example) | — | 42% |
| Ex. 8 | 20% | 52% |
| Ex. 9 | 40% | 86% |
| Ex. 4 | 60% | 92% |
| Ex. 10 | 80% | 95% |

As shown in Table 3, it is observed that the product length ratio increases in Experiments 4 and 8 to 10 as compared to Experiment 1 (typical process).

From the above, it is understood that Experiments 8 to 10 correspond to Inventive Examples of the invention, where the upper end of the straight body is located at the same level as the lower end of the heat shield without turning off the power of the heater and this state is held for 60 minutes, so that the product length ratio increases as compared to the typical process.

It is also observed that, when comparing only Experiments 4 and 8 to 10 to each other, the product length ratio increases as the power of the heater during the state holding step becomes greater. Especially, in Experiments 4, 9 and 10, the product length ratio exceeds 80%.

From the above, it is observable that the product length ratio significantly increases as compared to the typical process by setting the power of the heater at 40% or more when the upper end position of the straight body is at the same level as the lower end of the heat shield.

It is also observed based on the comparison with Experimentation 2 that the product length ratio increases irrespective of the power of the heater in the state holding step as the position of the upper end of the straight body becomes lower. It is believed in view of the above that the product length ratio further increases when the position of the upper end of the straight body is set lower than the lower end of the heat shield.

It is also found that the sample with the shortest product length among Experiments 2 to 4, 6, 7, 9 and 10 in which the power of the heater in the state holding step is 40% or more is the monocrystalline silicon of 700 mm straight body length in Experiment 6, and the length of the sample is 546 mm. Accordingly, it is found that the manufacturing method of the invention can produce a monocrystalline silicon including the straight body whose diameter is 400 mm or more, the straight body including a lengthwise continuous region of 540 mm or more whose change in resistivity is 5% or less before and after being subjected to a heat treatment at 650 degrees C. for 30 minutes.

What is claimed is:

1. A manufacturing method of a monocrystalline silicon using a monocrystal pull-up apparatus comprising: a crucible configured to receive a silicon material;
   a crucible driver configured to vertically move and rotate the crucible;
   a heater configured to heat the crucible to melt the silicon material;
   a pull-up portion configured to pull up a seed crystal after bringing the seed crystal into contact with a silicon melt in the crucible to grow the monocrystalline silicon;
   a hollow cylindrical heat shield disposed above the crucible and configured to surround the monocrystalline silicon; and
   a chamber configured to house the crucible, the heater and the heat shield, the method comprising:
   a growth step in which the seed crystal having contacted the silicon melt is pulled up and the crucible is rotated and raised to form a straight body of the monocrystalline silicon;
   a separating step in which the monocrystalline silicon is separated from the silicon melt;
   a state holding step in which the crucible and the monocrystalline silicon are lowered and the monocrystalline silicon is kept located below a level at which the monocrystalline silicon is separated from the silicon melt for a predetermined time; and
   a draw-out step in which the monocrystalline silicon is drawn out of the chamber.

2. The manufacturing method of a monocrystalline silicon according to claim 1, wherein
in the state holding step, an upper end of the straight body is kept at the same level as an upper end of the heat shield or is kept below the upper end of the heat shield for the predetermined time.

3. The manufacturing method of a monocrystalline silicon according to claim 1, wherein
in the state holding step, a power of the heater is kept in a range from 40% to 80% of the power at an end of a formation of the straight body.

4. The manufacturing method of a monocrystalline silicon according to claim 1, wherein
in the state holding step, an upper end of the straight body is kept at the same level as a lower end of the heat shield or is kept below the lower end of the heat shield for the predetermined time.

5. The manufacturing method of a monocrystalline silicon according to claim 1, wherein
the straight body grown in the growth step has a diameter of 400 mm or more.

6. The manufacturing method of a monocrystalline silicon according to claim 1, wherein
the straight body grown in the growth step has a resistivity in a range from 5 Ω·cm to 60 Ω·cm.

7. The manufacturing method of a monocrystalline silicon according to claim 1, wherein
the straight body grown in the growth step has an oxygen concentration of $1 \times 10^{17}$ atoms/cm$^3$ (ASTM 1979) or more.

8. The manufacturing method of a monocrystalline silicon according to claim 1, wherein
the monocrystalline silicon is drawn out in the draw-out step while the power of the heater is turned on, and
after the draw-out step, the silicon material is added in the crucible and a next monocrystalline silicon is manufactured by performing the growth step, the separating step, the state holding step and the draw-out step.

* * * * *